United States Patent
Smith

(10) Patent No.: US 6,262,710 B1
(45) Date of Patent: Jul. 17, 2001

(54) PERFORMING COLOR CONVERSION IN EXTENDED COLOR POLYMER DISPLAYS

(75) Inventor: Ronald D. Smith, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/318,452

(22) Filed: May 25, 1999

(51) Int. Cl.[7] .................................. G09G 5/02
(52) U.S. Cl. ...................... 345/150; 345/152; 345/153
(58) Field of Search .............................. 345/150, 30, 39, 345/41, 82, 22, 72, 84, 83, 431, 153, 430, 151, 152; 313/504, 506, 507; 257/13, 40, 103; 358/522; 349/47, 54, 97, 106, 107, 108, 109

(56) References Cited

U.S. PATENT DOCUMENTS

| | | | |
|---|---|---|---|
| 5,049,986 | * | 9/1991 | Aono et al. .......................... 358/522 |
| 5,091,718 | * | 2/1992 | Beatty .................................. 345/22 |
| 5,294,870 | * | 3/1994 | Tang et al. ........................... 313/504 |
| 5,363,477 | * | 11/1994 | Kuragano et al. ................... 345/426 |
| 5,544,284 | * | 8/1996 | Allebach et al. .................... 345/431 |
| 5,631,665 | * | 5/1997 | Takizawa et al. ..................... 345/88 |
| 5,747,182 | * | 5/1998 | Friend et al. ........................ 428/690 |
| 5,821,690 | * | 10/1998 | Martens et al. ...................... 313/506 |
| 5,835,099 | * | 11/1998 | Marimont ............................ 345/431 |
| 5,929,562 | * | 7/1999 | Pichler ................................. 313/506 |
| 5,952,778 | * | 9/1999 | Haskal et al. ........................ 313/504 |
| 6,030,700 | * | 2/2000 | Forrest et al. ....................... 428/336 |
| 6,140,986 | * | 10/2000 | Wilkinson et al. .................... 345/74 |

* cited by examiner

Primary Examiner—Matthew Luu
Assistant Examiner—Thu-Thao Havan
(74) Attorney, Agent, or Firm—Trop, Pruner & Hu, P.C.

(57) ABSTRACT

An extended color polymer display has light emitting elements of more than three colors. Tricolor color spaces are selected for color transformations from known color spaces such as sRGB. The color transformations may take into account not only the best implementation of the color scheme but also considerations related to computational complexity and power consumption reduction.

22 Claims, 6 Drawing Sheets

| LB | DR | LR | —20a |
| --- | --- | --- | --- |
| DR | LR | G | —20b |
| LR | G | LB | —20c |
| G | LB | DB | —20d |
| LB | DB | DR | —20e |

PERFORMING COLOR CONVERSION IN EXTENDED COLOR POLYMER DISPLAYS

BACKGROUND

This invention relates generally to polymer displays which have light emitting layers that are semiconductive polymers.

Polymer displays use layers of light emitting polymers. Unlike liquid crystal devices, the polymer displays actually emit light which makes them advantageous for many applications.

Generally, polymer displays use at least one semiconductive conjugated polymer sandwiched between a pair of contact layers. The contact layers produce an electric field which injects charge carriers into the polymer layer. When the charge carriers combine in the polymer layer, the charge carriers decay and emit radiation in the visible range.

One semiconductive conjugated polymer that may be used in polymer displays in poly(p-phenylenevinylene) (PPV) which emits green light. Another polymer which emits red-orange light is poly(methylethylhexyloxy-p-phenylenevinylene) (MEH-PPV). Other polymers of this class are also capable of emitting blue light. In addition, nitrile substitute conjugated polymers may be used in forming polymer displays. Still other polymers are discussed in U.S. Pat. No. 5,821,690 to Martens et al. and assigned to Cambridge Display Technology Limited.

Polymer displays are limited by the spectral characteristics of the specific polymers chosen. Currently available polymers for use in polymer displays have a rather wide potential color gamut. The most efficient emitters, both electrically and from a human sensitivity perspective, do not have a wide color gamut but instead are rather "pastel". There exist deep blue and deep red emitters, but because of the responsivity roll-off of the eye in the deep red and deep blue regions, these colors are not efficiently used.

Cambridge Display Technology Ltd. has proposed using more than the three standard red, green and blue colors in polymer displays, referred to herein as extended color polymer displays. For colors that are close to white or pastel, the more efficient emitters would be used. When these emitters are out of gamut, which occurs for deep red or deep blue for example, the other red and/or blue emitters are operated. If three out of the five available colors are used at any time one must determine which tricolor space to use in any given situation.

Thus, there is a continuing need for a way to implement extended color polymer displays.

SUMMARY

In accordance with one aspect, a method of operating a polymer display with more than three color emitters includes converting at least one pixel from a first tricolor space to a second tricolor space available in the display. A determination is made as to whether all of the colors of the first color space convert to actual colors of the second color space. If not, a third color space is chosen.

DETAILED DESCRIPTION

Figures 1, 2:
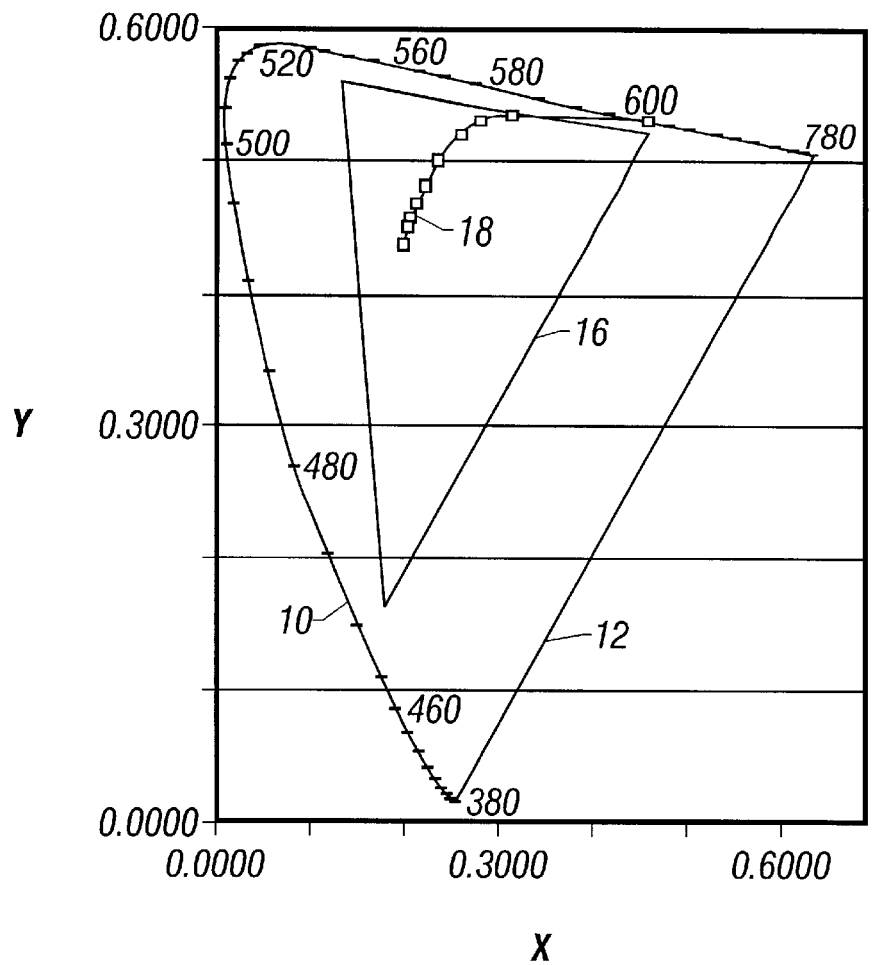
FIG. 1 is a CIE chromaticity diagram showing a known color space.
FIG. 2 is a tiling diagram for a five color polymer display.

Referring to FIG. 1, a standard chromaticity diagram includes X and Y axes as illustrated. The illustrated chromaticity diagram is in accordance with a standard for the measurement and specification of color defined by the Commission Internationale de l'Eclairage (CIE).

Pursuant to this standard, a spectral energy distribution (not shown) is defined for each of the three primary colors in the visible spectrum. Normally, it is desirable to define any visible color to be displayed in terms of the three primary colors. Spectral distributions in terms of wavelength for the CIE-defined primary colors are defined wherein the distributions are plotted with a measure of intensity on the vertical axis versus wavelength. A distribution for each of the primary colors results.

The spectral distribution for the three primary colors defined by the CIE is used to derive a two-dimensional coordinate space, as shown in FIG. 1, that comprehends all humanly visible colors at all levels of saturation. The chromaticity diagram is defined within a coordinate space between 0 and 1 on X and Y axes. The points that define the outer curve 10 of the chromaticity diagram are calculated by multiplying the CIE spectral distribution by a theoretically perfect narrow-band spectrum consisting of one frequency. If the X and Y coordinates are calculated for each discrete wavelength, a curve results which forms the outline 10 of the chromaticity diagram. This curve may be called the locus of pure spectral colors. It effectively represents pure monochromatic light in all the wavelengths within the visible spectrum.

Thus, referring to FIG. 1, the relatively C-shaped locus of pure spectral colors defines a plurality of wavelength values along its length indicated by the numbers next to the horizontal segments. The two ends of the curve represent the limits of the visible spectrum. The straight line 12 drawn between the extreme ends creates a closed shape whose interior defines all the possible colors and saturation levels visible to the human eye. The straight line is referred to as the locus of pure non-spectral colors or the line of purples. The non-spectral colors result from various combinations of red and blue to produce purple and violet in various shades.

Basically, the line 10 represents the outer limit of human color perception. The line 12 defines a less clear boundary since human perception of colors in this area fades away rather than abruptly stops as one crosses the line. The triangle 16 within the chromaticity diagram represents the calorimetric location of the red, green and blue phosphors in use in television sets today. Thus, it should be apparent that the full range of distinguishable colors is not representable by presently available television sets. The sweeping arc 18 represents the locus of colors produced by "black body" radiation from 1,000 to 10,000 degrees K.

Referring now to FIG. 2, an example of a tiling pattern for a five color polymer display is illustrated. In this embodiment, in addition to the green color, a light red and a dark red color are used together with a light blue and a dark blue color. This is intended as an example only and many other tiling patterns may be used. Each tile 20 represents a different one of the five colors that form the polymer display, including light red (LR) 20a, green (G) 20b, light blue (LB) 20c, dark blue (DB) 20b and dark red (DR) 20e. While a tiling pattern is described wherein each of the colors are laterally displaced from one another, vertically displaced patterns may be used as well as described for example in U.S. Pat. No. 5,821,690 to Martens et al. assigned to Cambridge Display Technology Ltd.

Figure 3:
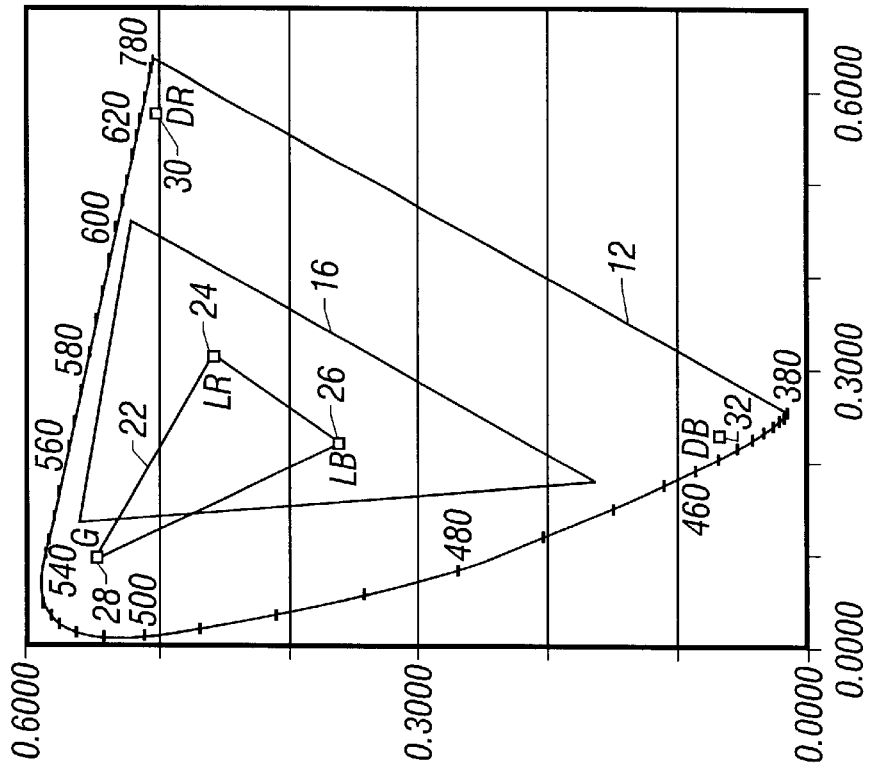
FIG. 3 is a hypothetical chromaticity diagram for the five color display shown in FIG. 2.

Referring now to FIG. 3, an example of one potential chromaticity diagram for the five colors used in a polymer display is illustrated. It should be understood that the exact points where the different color coordinates lie is not of any significance to the invention and the numbers and points utilized are purely hypothetical.

A primary color gamut 22 of green 28, light red 24 and light blue 26 and a color space extension of deep red 30 and deep blue 32 is illustrated. In this example, the green 28, deep red 30 and deep blue 32 coordinates could actually achieve a color gamut that is larger than the color gamut 16 achieved by conventional televisions. The primary color gamut 22 is much smaller than the color gamut 16 of sRGB color space. The color gamut 22 gives a power efficient display of the most frequently occurring colors which cluster around white and green. The eye is most sensitive to the midband green light and that sensitivity falls off as one moves toward the line of purples 12. Converting from the sRGB color space, one must deal with the fact that a non-linear transform must occur. This is because there are more outputs than inputs and negative results are disallowed. Moreover, it is desirable to minimize the total required computations and, in portable applications, to minimize the total power consumption.

Initially, all of the colors of one conventional color space may be converted to the primary color triangle 22 of the display. While the sRGB color space is used as an example of a conventional color space, the conversions may likewise take place from any conventional color space. If any of the values turn out to be negative, one can instead convert to another color triangle for the display. For example, as one moves from white to deep red, at first the pink color becomes more and more dominant up until the demanded color is no longer expressible inside the chosen color gamut. At this point, the largest possible color gamut triangle may be changed. However, if one suddenly changes to exclusive use of the red emitter, it is very likely to raise a complicated color balance problem.

This color balance problem can be considered by imagining a third axis perpendicular to the page which describes intensity. In this new volume graph, any output from the display can be described, with color on the plane of the page and brightness or intensity of that color, perpendicular to the page. Any tricolor space will form a plane in this space of color versus intensity since geometrically, three points define a plane, by definition. Having three points guarantees that any point in the triangle is critically planar. Of course, the plane may not be level and this is the color balance problem. If the plane is tilted, the white light point moves and there will be a perceived color shift. The plane may be tilted towards red or green for example.

During calibration of the display, the red and/or green and/or blue gain may be modified to produce a correct white light point which has the effect of making the color intensity plane parallel to the chromaticity plane. Adding more points to the color space makes it very hard for points to be critically planar. The difference between the balance of the first five colors is magnified by the relative tilt between the color space planes. This causes a sudden "jump" between colors during color space transition. For objects which have a smooth variation of color, this "jump" may show up as a spatial artifact at the transition boundary. This is true particularly because any color shift has both a color and a luminance component and the eye is particularly sensitive to the luminance shift.

Figure 4:
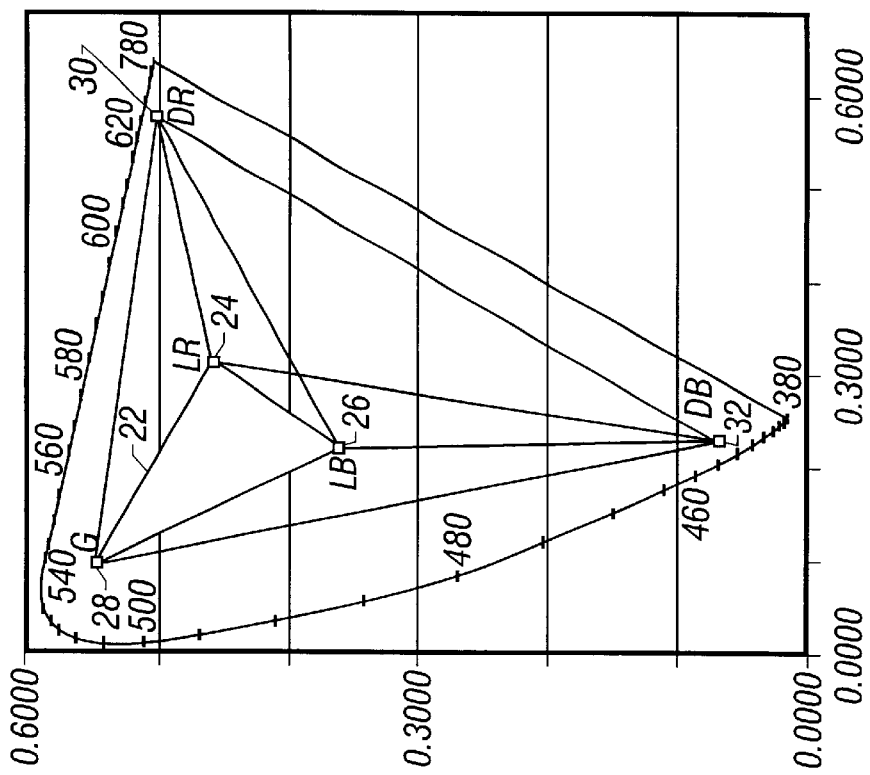
FIG. 4 is a hypothetical chromaticity diagram showing the potential tricolor spaces.

To solve this problem, the first color space is divided into all possible color triangles, as illustrated in FIG. 4. In the example of a five color system, there are a total of ten triangles formed where the corner of the triangle is located at a color emitted by the actual display. Each triangle forms a tricolor space that covers part of the maximum expressible color space possible by the display. The ten triangles are G-LR-LB, G-LR-DR, G-LB-DB, LB-DB-DR, LB-DB-LR, LR-DR-LB, LR-DR-DB, G-LB-DR, G-LR-DB and G-DB-DR.

The last triangle covers the maximum space but as discussed previously, it is the least desirable color space due to the power required. Thus, this color space is avoided when switching from one tricolor space to another tricolor space.

The triangle 22, G-LR-LB, is the primary color gamut that is normally used by the display when it is in its most efficient mode. This color gamut uses a 3×3 color conversion matrix to convert between the sRGB space of the graphics controller of a computer coupled to the display to the actual color space of the display. The transfer matrix equation is:

$$\begin{bmatrix} LR' \\ G' \\ LB' \end{bmatrix} = \begin{bmatrix} K_{1.1} & K_{1.2} & K_{1.3} \\ K_{2.1} & K_{2.2} & K_{2.3} \\ K_{3.1} & K_{3.2} & K_{3.3} \end{bmatrix} \begin{bmatrix} sR \\ sG \\ sB \end{bmatrix}$$

Any color point that lies within the central triangle 22 is correctly displayed and perceived by the normal vision when corrected by the primary matrix. The coefficients of the transfer matrix are a function of the materials chosen which form the color space as well as the particular nature of any given display. The general transfer matrix is a function of the design of the display and so these coefficients "K" are determined at design time. These coefficients may be modified to suit either user preferences, for example by providing a hue or tint control, or to correct for manufacturing variations between displays.

Other color points lie within other color triangles and so have their own respective color transforms. One color transform is used for each triangle. Normal operation has the most colors being displayed by the central color space and all colors are specified with at most three of the five colors. However, at some color, one or two of the resulting transformed values will be negative. The signs of the results and the arithmetic comparisons of the values allow one to determine which of the other six color spaces to use.

A software algorithm running as part of the operating system can convert the sRGB color space to the target color space of the display. Each pixel may use a 3×3 transform matrix. Some of the pixels may require an additional 3×3 matrix to shift color spaces for reasons to be described later. Alternatively, software can implement the color space transform when the display changes, and then only at pixels where the displayed data changes.

Any given pixel may have a current pixel transform that has been previously determined to efficiently map the pixel color to the display. When a display update occurs, it may be discovered that this pixel transform is no longer within a first tricolor gamut. The following algorithm presumes that the current pixel gamut is within the G-LB-LR tricolor space and that it is necessary to move to another space. The principles described however work for any of the tricolor spaces and the primary space is used only as an example.

At design time, the designer knows the location of the color coordinates of the polymers used in the display. Using a computer, the color coordinates are plotted on a CIE chromaticity diagram and all the possible tricolor triangles are determined.

Figure 5:
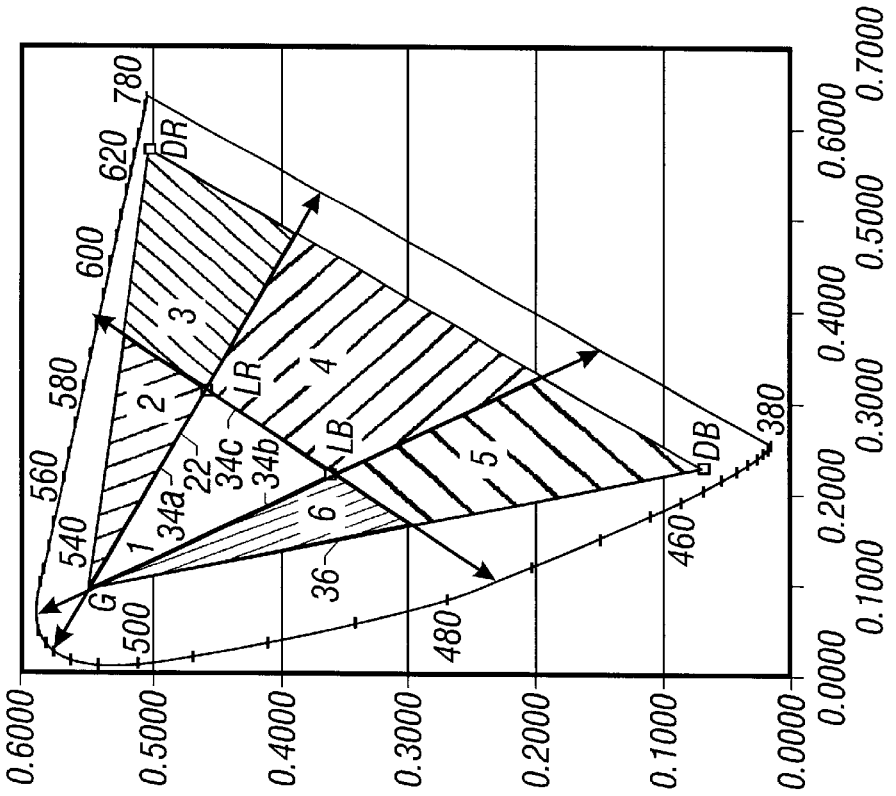
FIG. 5 is a hypothetical chromaticity diagram for a five color display, breaking the maximum available space into numbered regions in accordance with one embodiment of the present invention.

As shown in FIG. 5, using the central tricolor region 22 as an example, rays 34 are drawn extending the three sides of the triangle 22. Next arbitrary identifiers, such as numbers (1–6), are assigned each of the regions defined between the overall triangle 36 defined by green, deep red and deep blue. In this way, one can determine the region of a given color coordinate by simply looking at the sign bits of the computed color of the central region 22. For example, if all the sign bits are positive, region 1 corresponding to the triangle 22 is indicated. Region 2 is indicated by the sign bit for light blue (and only the light blue) being negative.

When region 2 is indicated, the only three possible tricolor spaces are G-LB-DR, G-LR-DR and G-DB-DR. The last color space is undesirable for the reason already described. Either of the other two color spaces change only one color, so the preferred color space is the one (of those two) which uses the least power. This can be readily computed by comparing the maximum demanded output power from dark red when in either of the two color spaces in region 2. In other words, the area of interest in the power computation is the intersection of the color space triangle and the region 2. Which of the two color spaces to choose can be determined at design time by simply calculating the power used and selecting, as the chosen color space, the one that uses less power.

If region 3 is indicated, there are five possible color spaces, G-LB-DR, G-LR-DR, LB-LR-DR, and two uninteresting cases, LR-DB-DR and G-DB-DR. Here the choice is possibly ambiguous. The safest choice is G-LB-DR which covers all of region 3 and which is also in the input sRGB color space. This choice minimizes the needed computations because only one additional matrix transform is required. However, this choice does not necessarily minimize power. Alternatively, one could chose between G-LB-DR and LR-LB-DR using a maximum likelihood heuristic. This may be determined from the data type. If the pixel belongs to graphics, one set of statistics is used. Graphics data tends to be either shades of gray or bright colors. Alternatively, if the pixel belongs to the video or image data type, another set of statistics are used to determine maximum likelihood. The worst case scenario is that the chosen color space also fails to contain the pixel. In this case, the remaining choice becomes obvious and the computation cost is two extra matrix transforms, not one.

Another heuristic examines the transform for a neighboring pixel, under the assumption that pixels are spatially correlated by color. One may assume that the adjacent pixel, already determined, provides the maximum likelihood information. Even though there is possibly a large variation of intensity between neighboring pixels, the color coordinates are typically close.

One may continue analyzing each region in turn to determine the choices and order the color spaces by power efficiency and by maximum likelihood. Either the region completely determines the next color space or is ambiguous. The other regions can be determined using these principles. For each color space, one divides the chromaticity diagram into regions and determines the next color space to choose based on the examination of the sign bits. After this has been done, a table can be set up where the address in the table is composed of the current color space number and the sign bits of the current transform. The output of the table is a list of the next color space to try in order of likelihood.

It is also desirable that the boundaries between tricolor spaces do not introduce spatially correlated artifacts. This can be most effectively determined by insuring that at most one color changes when changing color spaces. For example, consider two alternatives for a small color change from the primary color space near the G-LR ray 32a. The first is G-DR-LR and the second the G-LB-DR. The first alternative does not significantly change two of the values (G and LR) but only switches from LB (which is at the low output power) to DR which is also at the low output power. This only occurs when near a ray boundary. Nearness to the boundary can be determined with a simple arithmetic comparison, for example, using a eight bit number, near may be within 15 of zero, i.e. the lower four bits.

Figure 6:
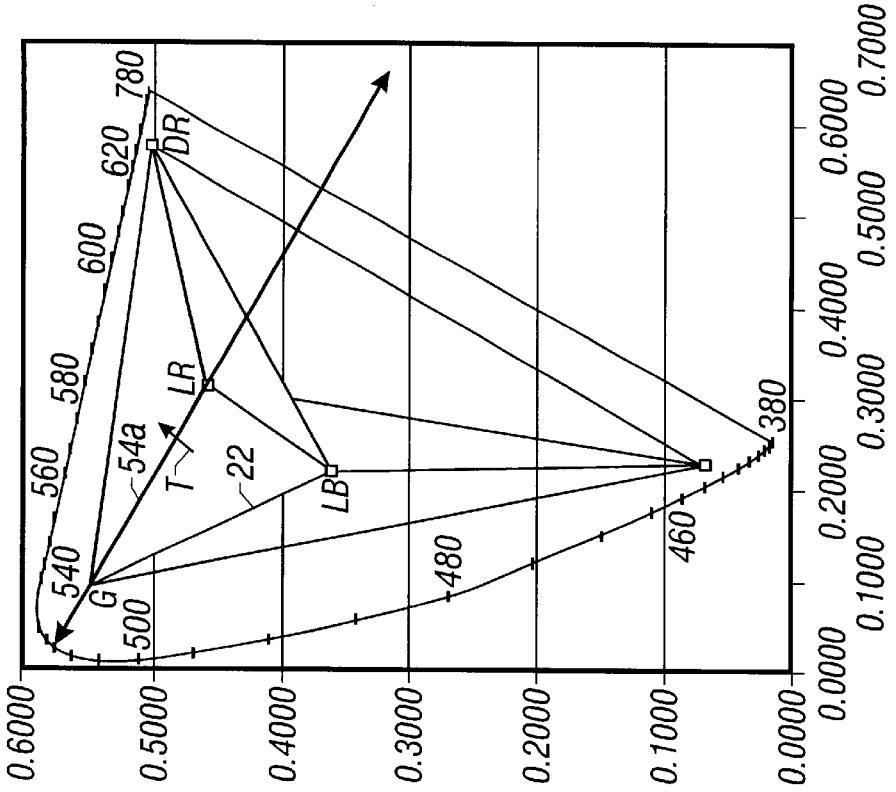
FIG. 6 is a hypothetical chromaticity diagram illustrating an edge crossing criteria in accordance with one embodiment of the present invention.

If in the old color space, the old color is near the G-LR boundary in the primary tricolor region 22, as illustrated in FIG. 6 at 54a, the new color space is determined to be G-LR-DR. This is because the G-LR boundary 54a is being crossed. This means there is a minimal shift in output power consumption between the color choice no longer being used (LB) and the new color choice to be used (DR).

By dividing up all the color spaces in all the regions and determining a transition table between the current color space and the most likely next color space, the power consumption can be held to a reduced level with low computational overhead.

Figure 7:
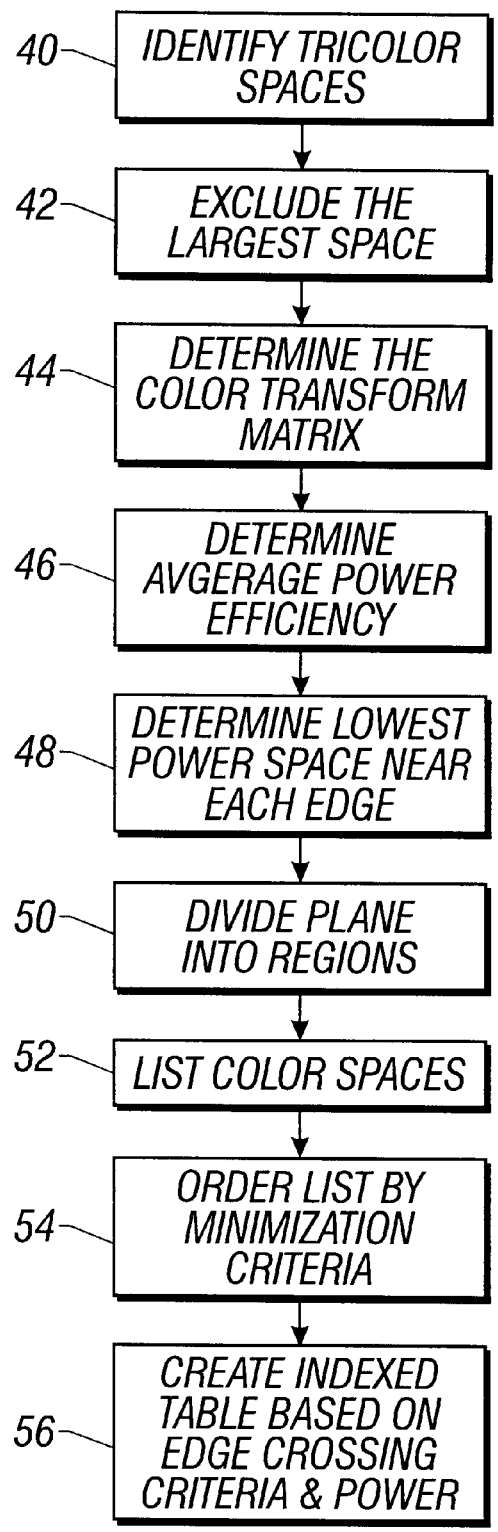
FIG. 7 is a flow chart for a method of designing a multicolor polymer display.

Referring now to FIG. 7, the process of designing the polymer display for five color color space transformations begins by choosing a collection of polymer colors such that each tricolor space covers the statistically likely colors and some other color space covers the maximum range of possible colors from the display. Once the colors have been selected, all possible tricolor spaces are identified that are composed of any choice of three colors out of the maximum number of colors, as indicated in block 40. Next, the largest color space is eliminated as indicated in block 42. For the remaining colors spaces, a color transform matrix is determined from the standard color space, such as sRGB, into each remaining color space, as indicated in block 44. Then the average power efficiency of each color space is determined by integrating the product of the power consumption at each point with the probability of that point occurring, as indicated in block 46. The color space with the lowest power consumption located adjacent to each edge of the color space is determined for developing the edge cross criteria, as indicated in block 48.

The tricolor space rays are extended to the edge of the chromaticity diagram and the plane is divided into regions, as illustrated by block 50 and in FIG. 5. For each region, the list of possible color spaces is determined, as shown in block 52, and the list of possible next color spaces are ordered according to minimization criteria, as suggested in block 54. Finally, a table is created, indexed by color spaces and region numbers as defined by the sign bits. The contents of the table are the list of color spaces based on the edge cross criteria and the spaces most likely to minimize power or most likely to minimize computational complexity, as illustrated by block 56.

Figure 8:
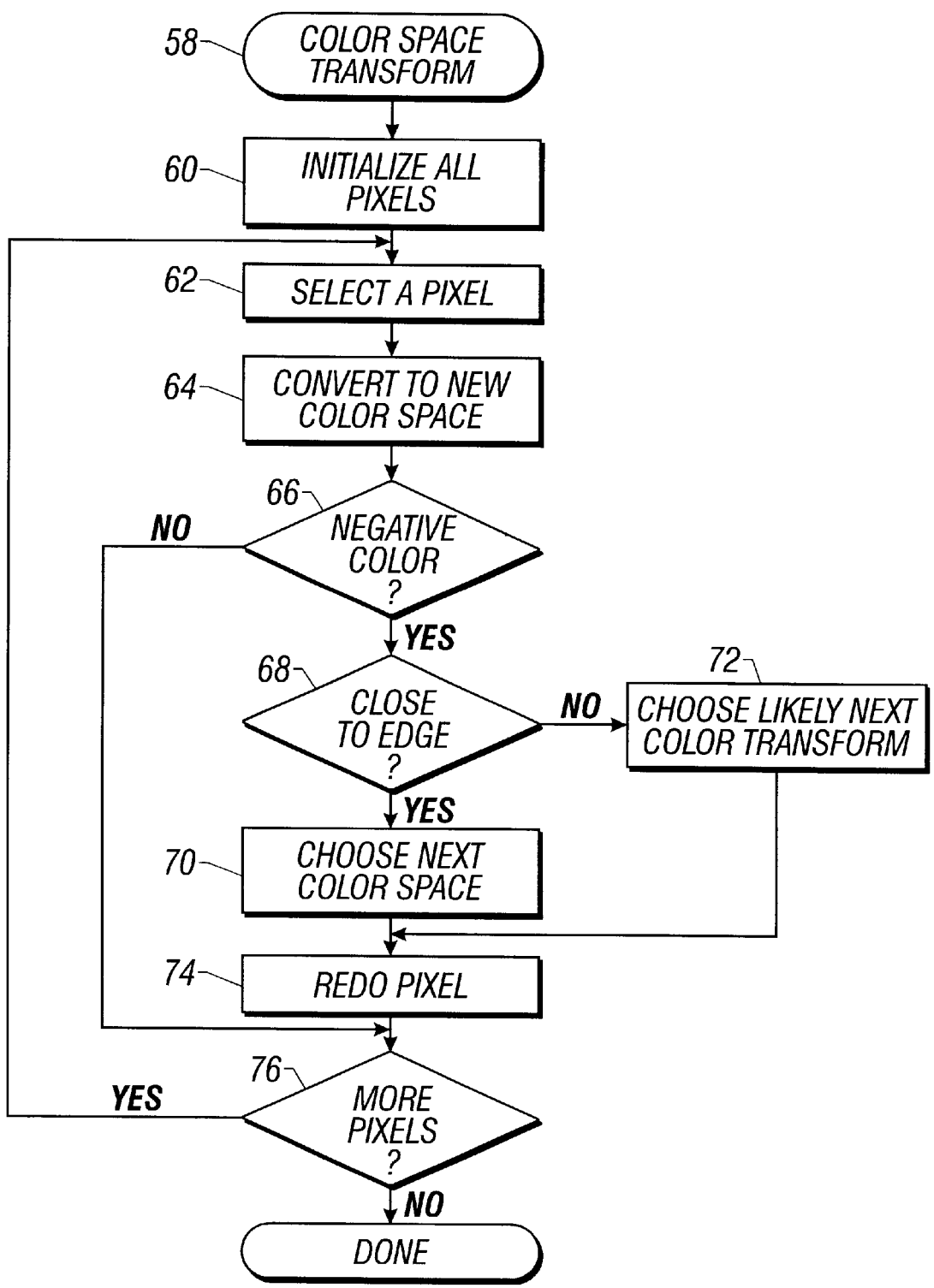
FIG. 8 is a flow chart for software for implementing color space transformations in extended color polymer displays.

At run time, software 58, shown in FIG. 8, may implement the color space transformation. In one embodiment, the software algorithm may run as part of the operating system using for example the color management software available in Windows® 98.

The software 58 initializes all the pixels (block 60). A pixel is selected to begin the analysis (block 62) and the pixel is converted to the chosen color space (block 64). If a negative color results, as indicated in diamond 66, a check determines if there is single negative color close to the edge (diamond 68). If there is no negative color, the transformation is complete for that pixel and the flow continues to analyze the remaining pixels (diamond 76).

If there is a negative color (diamond 66) and there is a negative color close to an edge (diamond 68), the next color space is chosen based on the edge cross criteria (block 70). If the edge crossing criteria is not met, the most likely next color transformation is chosen (block 72). In either case, the pixel is recomputed (block 74) and the flow either ends or continues to the next pixel.

Figure 9:
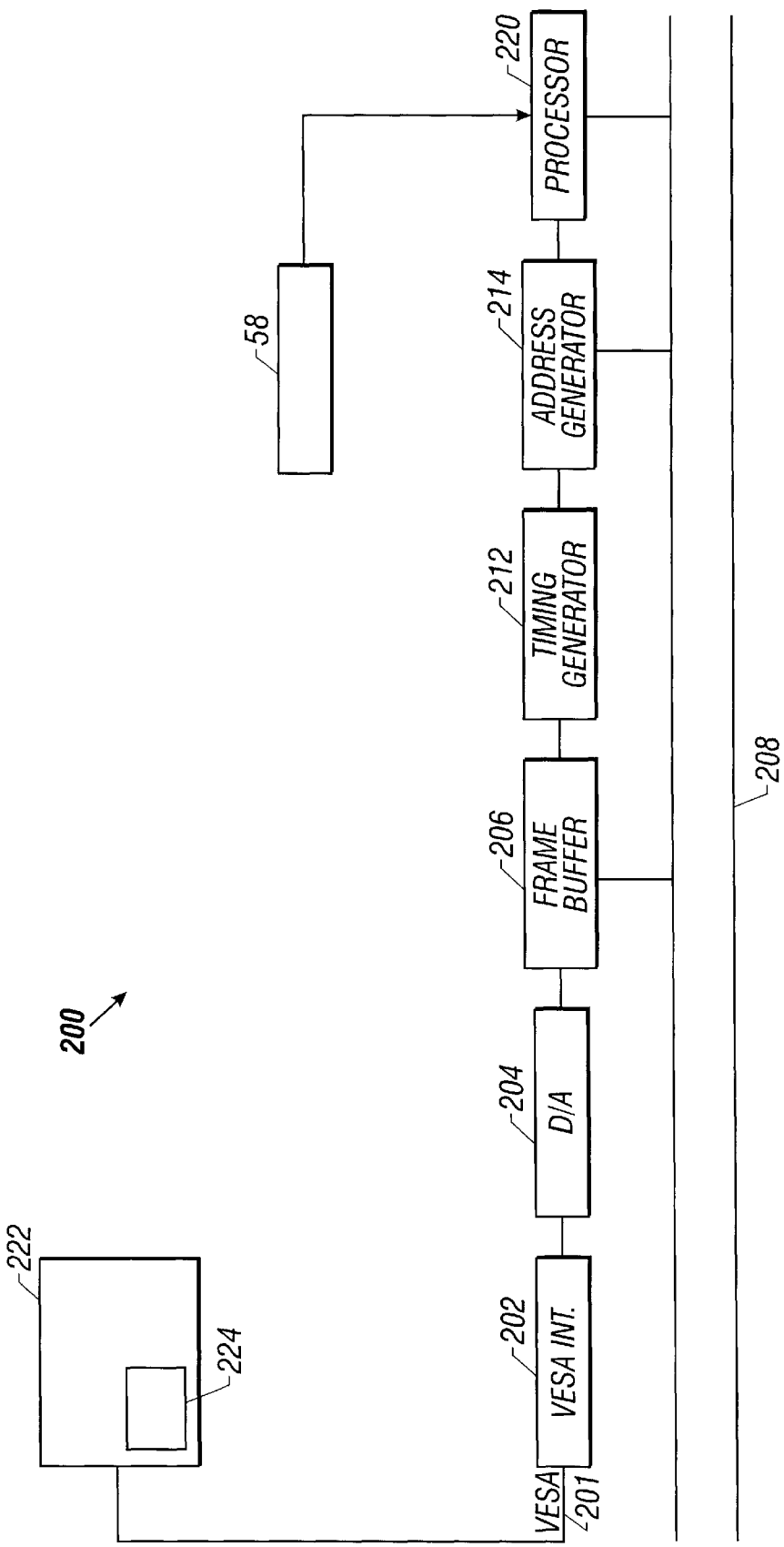
FIG. 9 is a block diagram of hardware for implementing one embodiment of the present invention.

Referring to FIG. 9, a display 200 that may be part of a computer system 222, such as a mobile or battery powered computer system, with a graphics controller 224, for example, or part of a standalone system. In particular, the display 200 may include a Video Electronic Standard Association (VESA) interface 202 to receive digital signals from a VESA cable 201 in one embodiment of the invention. The VESA standard is further described and the Computer Display Timing Specification, V.1, Rev. 0.8 and is available on the Internet at www.vesa.org/standard.html. These signals indicate images to be formed on the display and may be generated by a graphics controller 224 of the computer 222, for example. The digital signals are converted into analog signals by a digital-to-analog (D/A) converter 204 and the signals may be stored in a frame buffer 206. The timing generator may be coupled to the frame buffer 206 to regulate a frame rate by which the images are formed on the screen. A processor 220 may be coupled to the frame buffer 206 via bus 208. The software 58 may be loaded into the appropriate memory for controlling the processor 220.

In other embodiments, a digital interface may be used as described for example in the Digital Visual Interface Specification, Revision 1.0, Apr. 2, 1999 by the Digital Display Working Group (DDWG).

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of operating a polymer display with more than three color emitters comprising:

converting at least one pixel from a first tricolor space to a second tricolor space available in the display;

determining if all the colors of the first color space convert to actual colors of the second color space; and if not, choosing a third tricolor space available in the display.

2. The method of claim 1 wherein determining if all the colors of the first color space convert to actual colors of the second color space includes determining whether the transformation between the color spaces results in negative numbers.

3. The method of claim 1 further including determining whether the transformation is close to an edge of a triangle defined by the chromaticity diagram of the first color space and if so choosing an adjacent color space as the third color space.

4. The method of claim 1 including checking a database containing information about the power consumption of a given tricolor space to determine whether to select the tricolor space as the second tricolor space.

5. The method of claim 1 including checking a database to determine the second tricolor space based on the computational complexity of the conversion from the first tricolor space to the second tricolor space.

6. The method of claim 1 including determining all the potential tricolor spaces available given the color emitters of the display, excluding the largest tricolor space and determining the power efficiency of each tricolor space.

7. An article comprising a medium for storing instructions that cause a processor-based system to:

convert at least one pixel from a first tricolor space to a second tricolor space available in a polymer display with more than three color emitters;

determine if all the colors of the first color space convert to actual colors of the second color space; and if not, choose a third tricolor space available in the display.

8. The article of claim 7 further storing instructions that cause a processor-based system to determine whether the transformation between the color spaces results in negative numbers.

9. The article of claim 7 further storing instructions that cause a processor-based system to determine whether the transformation is close to an edge of a triangle defined by the chromaticity diagram of the first color space and if so choose an adjacent color space as the third color space.

10. The article of claim 7 further storing instructions that cause a processor-based system to check a database containing information about the power consumption of a given tricolor space to determine whether to select the tricolor space as the second tricolor space.

11. The article of claim 7 further storing instructions that cause a processor-based system to check a database to determine the second tricolor space based on the computational complexity of the conversion from the first tricolor space to the second tricolor space.

12. The article of claim 7 further storing instructions that cause a processor-based system to determine all the potential tricolor spaces available given the color emitters of the display, and exclude the largest tricolor space and determining the power efficiency of each tricolor space.

13. A method of designing a polymer display with more than three color emitters comprising:

identifying the potential tricolor spaces available given the color emitters of the display;

developing a color transfer matrix from an input color space to a plurality of potential tricolor spaces; and determining the power efficiency of a plurality of potential tricolor spaces.

14. The method of claim 13 including selecting from among the potential tricolor spaces those with lower power consumption.

15. The method of claim 13 further including dividing the available color space into a primary color space and color regions around said color space defined by extending the sides of the primary tricolor space.

16. The method of claim 15 including creating a database with information about one or more of the power consumption of tricolor spaces adjacent a first tricolor space, the power consumption of the available tricolor spaces and the computational complexity of each of said tricolor spaces.

17. A polymer display comprising:
   more than three polymer emitters of different wavelengths; and
   a controller adapted to convert an input tricolor space to a tricolor space of said display that either reduces power consumption or the computational complexity of the conversion.

18. The display of claim 17 including green, light red, dark red, light blue and dark blue emitters.

19. The display of claim 17 including a database coupled to said controller with information about the power consumption of a plurality of tricolor spaces.

20. The display of claim 19 wherein said database also includes data about the computational complexity of a plurality of tricolor space conversions.

21. The display of claim 19 wherein said controller is adapted to determine which of two potential tricolor spaces produces the least change of the colors used in the preceding tricolor space.

22. The display of claim 19 wherein said controller is adapted to convert to a tricolor space that optimizes computational simplicity and power consumption.

* * * * *